United States Patent
Nemoto

(10) Patent No.: US 6,246,284 B1
(45) Date of Patent: Jun. 12, 2001

(54) NEGATIVE FEEDBACK AMPLIFIER WITH AUTOMATIC GAIN CONTROL FUNCTION

(75) Inventor: Masahisa Nemoto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/503,841

(22) Filed: Feb. 15, 2000

(51) Int. Cl.[7] .................................................. H03F 1/36
(52) U.S. Cl. .......................... 330/110; 330/86; 330/308; 250/214 A
(58) Field of Search .......................... 330/86, 110, 282, 330/292, 308; 250/214 A, 214 AG

(56) References Cited

U.S. PATENT DOCUMENTS

| | | | |
|---|---|---|---|
| 3,588,729 | * 6/1971 | Satterfield | 330/207 P |
| 5,210,503 | * 5/1993 | Sawamura | 330/110 |
| 5,302,911 | * 4/1994 | Miyashita | 330/110 |
| 6,140,878 | * 10/2000 | Masuta | 330/308 |

FOREIGN PATENT DOCUMENTS 10-284953   10/1998 (JP).

* cited by examiner

Primary Examiner—Robert Pascal
Assistant Examiner—Henry Choe
(74) Attorney, Agent, or Firm—Venable; Robert J. Frank; Allen Wood

(57) ABSTRACT

There is disclosed a negative feedback amplifier provided with a feedback circuit used to make impedance variable and to improve high frequency characteristics and so configured to prevent a problem of parasitic capacity caused by a by-pass condenser. The feedback circuit connected in parallel to an inverting amplifier circuit is composed of a first feedback resistor connected in parallel to the inverting amplifier circuit, and a second feedback resistor and the by-pass condenser, both being connected in parallel to the first feedback resistor, and both ends of the by-pass condenser, together with the second feedback resistor, can be connected to the inverting amplifier circuit via first and second switching devices.

10 Claims, 2 Drawing Sheets

NEGATIVE FEEDBACK AMPLIFIER WITH AUTOMATIC GAIN CONTROL FUNCTION

BACKGROUND OF THE INVENTION

1. Field of the Invention

The present invention relates to a negative feedback amplifier being suitably used for a high-speed optical communication system and more particularly to a negative feedback amplifier with automatic gain control function that allows automatic control of a gain.

2. Description of the Related Art

An optical communication system employs an optical-electrical converter used to convert an optical signal to an electrical signal. The electrical signal obtained from the optical-electrical converter such as a photodiode is amplified by a negative feedback amplifier. Such negative feedback amplifiers are disclosed in Japanese Laid-open Patent Application No. 10-284953. The disclosed negative feedback amplifier is comprised of an inverting amplifier circuit and a first feedback resistor connected in parallel to the same. In the above disclosed negative feedback amplifier, a second feedback resistor which can be connected in parallel to the first feedback resistor through a switching device. When a gain of the feedback amplifier is not more than a predetermined value, the switching device is in an open state, while, when the gain exceeds the predetermined value, the switching device is in a closed and connected state. If the gain of the feedback amplifier exceeds the predetermined value much and changes greatly, the switching device is so operated that its opening and closing operation serves to change impedance of the feedback amplifier, thus enabling the gain of the feedback amplifier to be maintained within a specified range.

When the second feedback resistor is connected to the feedback circuit to reduce the gain, due to a decrease in the impedance of the feedback circuit, frequency characteristics of the impedance extends. At this point, in the high frequency range, a peak may appear in the frequency characteristics of the impedance in some cases. In order to remove the peak in the high frequency range, in the disclosed negative feedback amplifier as shown in FIG. 3 of the publication, it is proposed that a by-pass condenser is additionally connected in parallel to the second resistor. By inserting such a by-pass condenser, the frequency characteristics are flattened while the impedance of the feedback circuit is in a lowered state, thus providing better amplifying characteristics.

However, in the above-mentioned conventional negative feedback amplifier, though one end of the by-pass condenser is interrupted from the inverting amplifier circuit due to interrupting actions of the switching device while the by-pass condenser is not in an active state, the other end of the by-pass condenser is connected to an output terminal of the inverting amplifier circuit. Because of this, parasitic capacity of the by-pass condenser is added to the inverting amplifier circuit, thus causing bad influence on the frequency characteristics of the negative feedback amplifier.

SUMMARY OF THE INVENTION

In view of the above, it is an object of the present invention to provide a negative feedback amplifier comprised of a by-pass condenser which can smoothly make impedance of its feedback circuit variable, thus improving frequency characteristics of the amplifier and eliminating a problem of parasitic capacity caused by the by-pass condenser mounted thereon.

According to a first aspect of the present invention, there is provided a negative feedback amplifier for use with integrated circuits comprising an inverting amplifier circuit provided with an input terminal and an output terminal used to amplify an input signal fed to the input terminal and to output the amplified signal in reverse phase and a feedback circuit mounted between the input terminal and the output terminal in parallel to the inverting amplifier circuit;

whereby the feedback circuit has a first feedback resistor connected between the input terminal and the output terminal, a first switching device one end of which is connected to the input terminal and which is put in an open state while a gain of the output signal to the input signal is not more than a predetermined value and is put in a closed and connected state while the gain exceeds the predetermined value, a second switching device one end of which is connected to the output terminal and which is put in an open state while the gain is not more than the predetermined value and is in a closed and connected state while the gain exceeds the predetermined value, a second feedback resistor connected between both switching devices and connected in parallel to the first feedback resistor used to decrease impedance of the feedback circuit by closing and connecting operations of the switching devices, and a by-pass condenser connected in parallel to the second feedback resistor used to improve flatness of frequency characteristics for high frequency components or region on an output signal from the output terminal while the both switching devices are in a closed and connected state.

In the foregoing, a preferable mode is one wherein the first and second switching devices are variable impedance devices the impedance of which is changed depending on a voltage applied between both terminals of the switching devices.

Also, a preferable mode is one wherein the variable impedance devices are comprised of diodes which allow a current to flow when a voltage applied to both ends of the diodes exceeds the predetermined value.

Also, a preferable mode is one wherein the variable impedance devices are field effect transistors (FET) having a pair of electrodes composed of a source and a drain, and a gate.

Furthermore, a preferable mode is one wherein one electrode of a first FET is connected to the input terminal, the other electrode of the first FET is connected to one end of the second feedback resistor, the gate is connected to either electrode of the pair of electrodes of the first FET, one electrode of a second FET is connected to the other end of the feedback resistor and the other electrode of the second FET is connected to the output terminal, and the gate is connected to either electrode of the pair of electrodes of the second FET.

It is also preferable that the first FET is an enhancement mode n-channel FET a drain and a gate of which are connected to the input terminal and a source of which is connected to the one end of the second feedback resistor, and the second FET is an enhancement mode n-channel FET a drain and a gate of which are connected to the other end of the second feedback resistor and a source of which is connected to the output terminal.

Also, it is preferable that a voltage difference between the source and the gate of each of the FETs becomes equal to a threshold value of each of the FETs when the gain reaches the predetermined value.

Also, it is preferable that each of the FETs reduces impedance between the source and the drain when a voltage difference between the source and the gate of each of the FETs exceeds a threshold value of each of the FETs, causing the second feedback resistor connected between both FETs to be connected substantially to the feedback circuit.

Also, it is preferable that each of the FETs is an enhancement mode transistor having a high impedance which substantially interrupts the second feedback resistor from the feedback circuit when a voltage difference between the source and the drain is 0 (zero) volts.

Furthermore, it is preferable that the by-pass condenser is substantially interrupted from the feedback circuit when a voltage difference between the source and the gate of both FETs is not more than a threshold value of each of both FETs, preventing the occurrence of parasitic capacity caused by the insertion of the by-pass condenser in the inverting amplifier circuit.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Best modes of carrying out the present invention will be described in further detail using various embodiments with reference to the accompanying drawings.

First Embodiment

Figure 1:
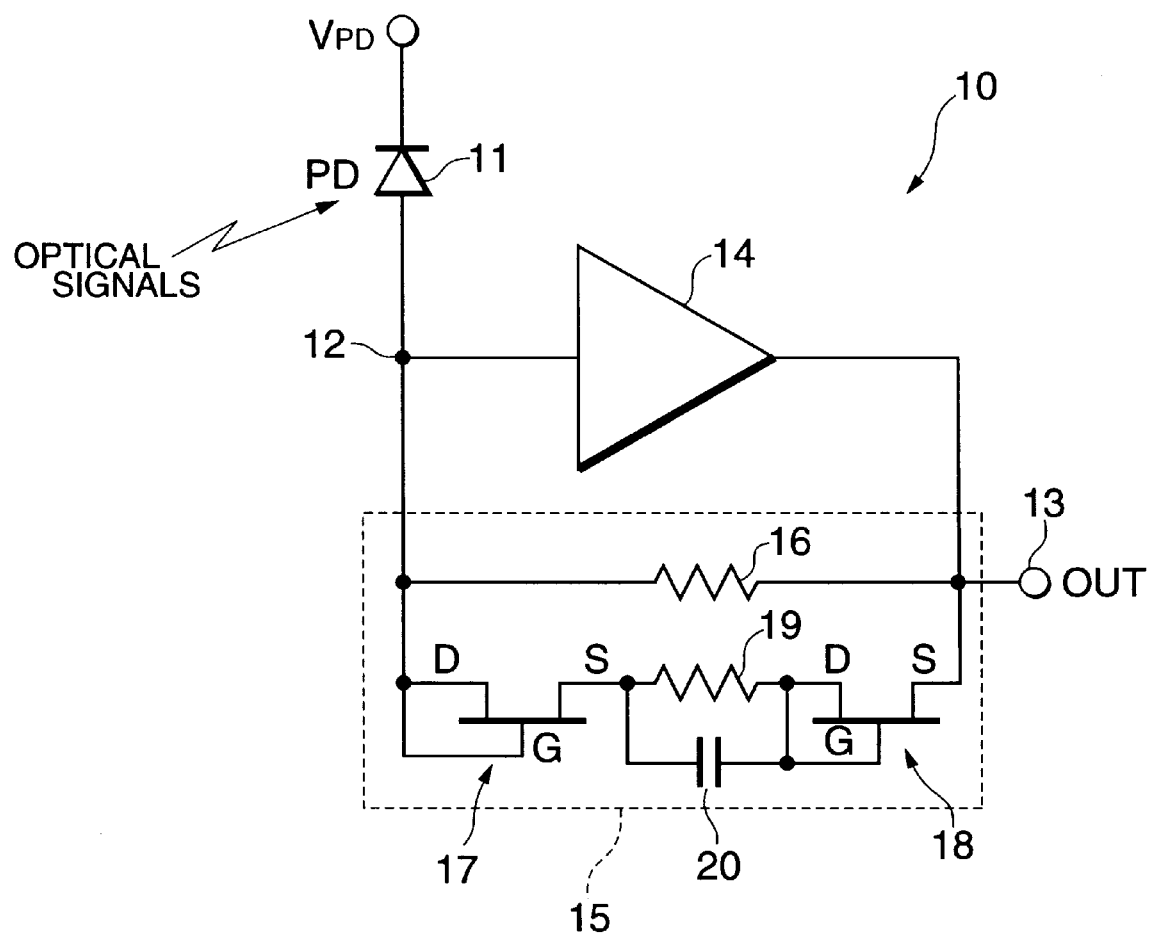
FIG. 1 is a schematic circuit diagram showing a negative feedback amplifier with automatic gain control function according to a first embodiment of the present invention.

FIG. 1 shows an example in which a negative feedback amplifier of the present invention is used in combination with an optical-electrical converter of an optical communication system. As depicted in FIG. 1, the negative feedback amplifier 10 is connected to an optical-electrical converter composed of a light receiving device such as a photodiode 11.

The negative feedback amplifier 10 is comprised of an input terminal 12, an output terminal 13, an inverting amplifier circuit 14 used to output a signal obtained by amplifying an input signal inputted into the input terminal 12 to an output terminal 13 in reverse phase with the inputted signal and a feedback circuit 15 connected in parallel to the inverting amplifier circuit 14and used to connect the input terminal 12 to the output terminal 13. An open loop gain "A" is obtained by this inverting amplifier circuit 14.

A reverse bias voltage Vpd is applied between an anode and a cathode of the photodiode, which is connected to the inverting amplifier circuit 14 so that the anode voltage is applied to the input terminal 12 of the inverting amplifier circuit 14. Therefore, when optical signals enter the photodiode 11, the anode current increases and an input voltage V to be applied to the input terminal 12 of the inverting amplifier circuit 14 increases by the increased amount of the anode current, resulting in an increase of an input current I to the input terminal 12.

The feedback circuit 15 has a first feedback resistor 16 connected in parallel to the inverting amplifier circuit 14 and inserted between the input terminal 12 and the output terminal 13, first and second switching devices 17 and 18 one end of which is connected respectively to the input terminal 12 and the output terminal 13, a second feedback resistor 19 connected in parallel to the first feedback resistor 16 through both switching devices 17 and 18 and a by-pass condenser 20.

In the case of the example shown in FIG. 1, the first and second switching devices 17 and 18 are comprised of enhancement mode n-type FETs (Field Effect Transistor) each having a pair of electrodes composed of a source, a drain and a gate used to control a drain current flowing through an n-type channel formed between both electrodes.

When a voltage of each gate (i.e., a potential between source and gate) of the enhancement mode n-type FETs 17 and 18 is not more than a threshold voltage of each FET, since it causes a high impedance to exist between the source and drain constituting a pair of the electrodes, both electrodes of the FETs are substantially kept in a cut-off state. If the gate voltages exceed their threshold voltages, since it causes a low impedance to exist between the source and drain of the FETs, there is continuity between the source and drain of the same. It is therefore desirable that both the FETs have the same characteristics. The drain (D) of the FET used as the first switching device is connected to the input terminal 12 of the inverting amplifier circuit 14 and the gate (G) of the FET is connected to the drain (D). The source (S) of the first FET is connected to each end of the second feedback resistor 19 and the by-pass condenser 20. The drain (D) and the gate (G) of the FET used as the second switching device are connected to each of other end of the second feedback resistor 19 and the by-pass condenser 20. The source (S) of the second FET is connected to the output terminal 13 of the inverting amplifier circuit 14.

Accordingly, the second feedback resistor 19 and the by-pass condenser 20 are so disposed that they can be connected in parallel to the first feedback resistor 16 through the first and second switching devices 17 and 18 positioned at both ends thereof.

When the photodiode receives light and causes a current flowing through the input terminal 12 of the inverting amplifier circuit 14 to be increased, because of an inverting amplifying action of the inverting amplifier circuit 14, the voltage from the output terminal 13 drops by the increases amount of the current flowing through the input terminal 12 of the inverting amplifier circuit 14. The partial voltage between the input terminal 12 and the output terminal 13 of the inverting amplifier circuit 14 is applied as a gate voltage to the FETs 17 and 18.

Accordingly, if a gate voltage of each of the FETs 17 and 18 is not more than the above threshold value, since it causes the high impedance to exist between the source and drain of FETs 17 and 18, both electrodes (i.e., between the source and the drain) of each of the FETs 17 and 18 are in an open state, i.e., in a cut-off state. While each of the FETs 17 and 18 is in the open state, both ends of the second feedback resistor 19 and the by-pass condenser are isolated from the input terminal 12 and the output terminal 13 of the inverting amplifier circuit 14. As a result, in this case, it means that the feedback circuit 15 to connect the input terminal 12 to the output terminal 13 of the inverting amplifier circuit 14 is comprised substantially of the first feedback resistor 16.

On the other hand, if the voltage of the output terminal 13 of the inverting amplifier circuit 14 greatly drops due to an increased output intensity of the photodiode 11, causing the voltage between the input terminal 12 and the output terminal 13 of the inverting amplifier circuit 14 to be increased and, as a result, the gate voltages of the FETs 17 and 18 exceed the threshold voltage of the same, since it causes the low impedance to exist between the source and the drain of the FETs 17 and 18, both electrodes (i.e., between the source and the drain) are closed and connected, therefore, causing continuity to exist between both electrodes.

When both the FETs 17 and 18 are in a closed and connected state, both ends of the second feedback resistor 19 and the by-pass condenser 20 are connected to the input terminal 12 and the output terminal 13 of the inverting amplifier circuit 14, it means that the feedback circuit 15 connecting the input terminal 12 and the output terminal 13 of the inverting amplifier circuit 14 is comprised substantially of the second feedback resistor 19 and by-pass condenser 20 connected in parallel to each other.

Next, operations of the negative feedback amplifier 10 are described. To simplify descriptions of this operation, as described above, each of the FETs 17 and 18 is used as an opening and closing switching device and the impedance across the FETs (i.e., between the source and drain of the same) is disregarded.

The gain of the negative feedback amplifier 10 is generally represented by a ratio of an output voltage to an input voltage, which is called "transimpedance Zt". The transimpedance is given by the following formula:

$$Z_t = \Delta V_{out}/\Delta I_{in} = R_f \times \{A/(A+1)\} \quad (1)$$

where $\Delta V_{out}$ represents changed amount of potentials of the output terminal 13, $\Delta I_{in}$ represents changed amount of currents flowing into the input terminal 12, $R_f$ represents impedance of the feedback circuit 15 and A represents the open loop gain of the inverting amplifier circuit 14.

As is apparent from the formula (1), the transimpedance $Z_t$ increases or decreases in proportion to impedance $R_f$ of the feedback circuit 15.

The impedance $R_f$ of the feedback circuit 15 in a state of the FETs 17 and 18 being closed or connected is given by the following formula, provided that the impedance of the FETs 17 and 18 is disregarded:

$$1/R_f = 1/R_{16} + 1/\{(1/R_{19})^2 + (\omega C_{20})^2\}^{1/2} \quad (2)$$

where $R_{16}$ represents a resistance value of the first feedback resistor 16, $R_{19}$ represents a resistance value of the second feedback resistor 19 and $\omega$ represents an angular frequency of a high frequency component and $C_{20}$ represents a capacity of the by-pass condenser.

The impedance $R_f$ of the feedback circuit 15 in a state of the FETs being opened is expressed as follows:

$$1/R_f = 1/R_{16} \quad (3)$$

As is apparent from the comparison of the formula (2) with (3), the impedance $R_f$ of the feedback circuit 15 increases or decreases by opening and closing operations of the FETs 17 and 18. Moreover, as shown in the formula (1), the impedance $Z_t$ increases or decreases depending on the impedance $R_f$.

If the voltage of the output terminal 13 of the inverting amplifying circuit 14 is not more than a specified value, the FETs 17 and 18 are maintained in an open state. While the FETs 17 and 18 are in an open state, the impedance $R_f$ of the feedback circuit 15, as shown in the formula (3), is represented by the resistance value $R_{16}$ of the first feedback resistor 16.

On the other hand, if the voltages of gates of the FETs exceed the above described threshold value due to an increase of the transimpedance $Z_t$ induced by an increase of the current inputted to the input terminal 12, the FETs 17 and 18 are put into a closed and connected state. When the FETs 17 and 18 are closed and connected, the impedance $R_f$ of the feedback circuit 15, as shown in the formula (2), the resistance ($R_{19}$) of the component of the direct current of the second feedback resistor 19 is lowered. The lowering of the impedance $R_f$ of the feedback circuit 15 causes the transimpedance $Z_t$ to decrease, as shown in the formula (1).

Moreover, since the by-pass condenser 20 provides a by-passing function, an increase of the impedance of the feedback circuit in a high frequency area caused by a high frequency component can be controlled. Accordingly, because the impedance characteristics of the feedback circuit 15 can be flattened, an excellent characteristic of the transimpedance $Z_t$ can be obtained in a wide frequency range.

When the current inputted to the input terminal 12 of the inverting amplifying circuit 14 is decreased due to the lowered transimpedance $Z_t$, the voltage between the input terminal 12 and the output terminal 13 decreases. If the voltage of gates of the FETs 17 and 18 is not more than the threshold value due to the decrease in the voltage between these terminals, the FETs are again put into an open state. If the FETs are again in the open state, the impedance $R_f$ of the feedback circuit 15 is increased and becomes the resistance value $R_{16}$ of the second feedback resistor 19, thus causing the transimpedance to be increased.

Therefore, according to the feedback amplifier 10 of the present invention, the impedance $R_f$ of the feedback circuit 15 is properly increased or decreased owing to automatic opening and closing operations of the FETs 17 and 18, thus allowing the gain of the negative feedback amplifier 10 to be maintained preferably in a predetermined range.

Moreover, when the by-pass condenser 20 is interrupted from the feedback circuit 15, both ends of the by-pass condenser 20 are adapted to operate so that the inverting amplifier 14 is surely interrupted from the input terminal 12 and the output terminal 13 owing to the opening operation of the FETs connected to both ends of the by-pass condenser 20.

This prevents one end of the by-pass condenser being hanged by the input terminal 12 or output terminal 13 of the inverting amplifier circuit 14 and, therefore, the inverting amplifier circuit 14 is not affected by parasitic capacity caused by the hanged by-pass condenser 20. Accordingly, changes in frequency characteristics of the inverting amplifier circuit 14 caused by the parasitic capacity can be prevented and thus variations in operational characteristics of the feedback amplifier 10 caused by the changes in such frequency characteristics of the inverting amplifier circuit 14 can be removed.

Also, p-type enhancement mode FETs instead of the n-type enhancement mode FETs (17 and 18) may be used. When p-type enhancement mode FETs are employed, a source and a drain of each FET is in a relationship being opposite to those shown in FIG. 1 where the n-type enhancement FETs are used.

Moreover, instead of the enhancement mode FETs, depletion mode FETs may be used. In the case of the depletion mode FETs, however, a desired operation cannot be implemented even if their gates are connected to the drain. Therefore, a special bias circuit is required for a gate voltage used to operate each of the depletion mode FETs by using a voltage between the input terminal 12 and output terminal 13 of the inverting amplifying circuit 14. Accordingly, as described above, by using the enhancement mode FETs, no special bias circuit is required and, by connecting each gate of the enhancement mode FETs to each of their drains, opening and closing operations of each of the FETs are made possible.

Second Embodiment

Figure 2:
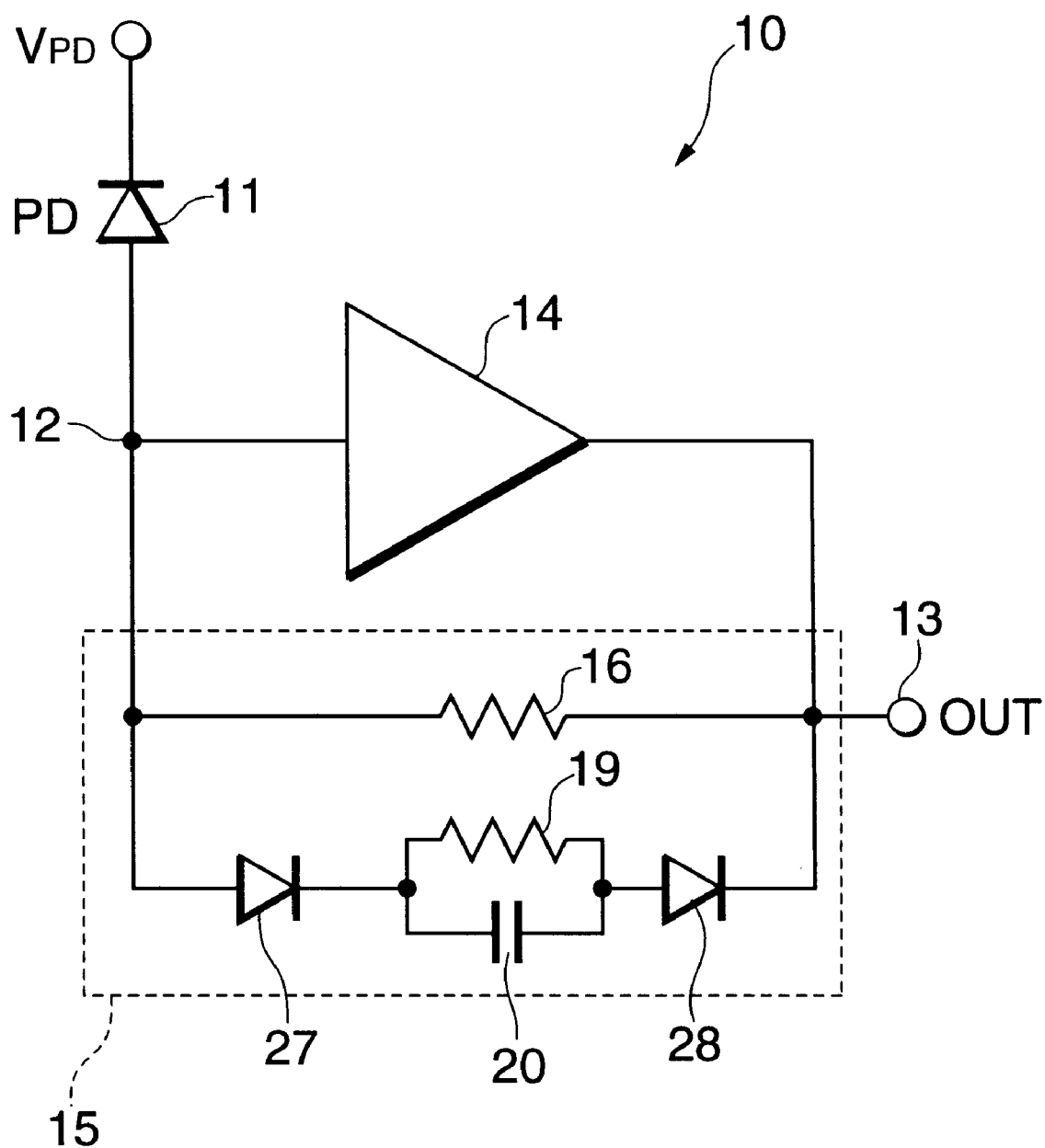
FIG. 2 is a schematic circuit diagram showing a negative feedback amplifier with automatic gain control function according to a second embodiment of the present invention.

In the negative feedback amplifier 10 of the second embodiment shown in FIG. 2, diodes 27 and 28 are used as switching devices instead of FETs. As depicted in FIG. 2, an anode of a first diode 27 is connected to an input terminal of an inverting amplifier circuit 14 and an cathode of the first diode 27 is connected to each end of a second feedback resistor 19 and a by-pass condenser 20 so that each of the diodes 27 and 28 is forward-biased. The anode of the second diode 28 is connected to each end of the second feedback resistor 19 and the by-pass condenser 20 and its cathode is connected to the input terminal of the inverting amplifier circuit 14.

To both ends of the diodes 27 and 28 is applied a partial voltage of the voltage occurring between the input terminal 12 and output terminal 13 of the inverting amplifier circuit 14 in the same manner as for the FETs described in the first embodiment. If the partial voltage to be applied to each of the diodes 27 and 28 is not more than a forward rising voltage (i.e., a forward bias voltage), both ends of the switching devices 27 and 28 composed of each of the diodes are put in an open state. When the partial voltage to be applied to each of the diodes 27 and 28 exceeds the forward rising voltage (i.e., the forward bias voltage) as the voltage between the input terminal 12 and the output terminal 13 of the inverting amplifier circuit 14 increases, both switching devices 27 and 28 are put into a closed and connected state.

An impedance $R_f$ of a feedback circuit 15 can be properly adjusted by opening and closing operations of each of the switching devices 27 and 28, as in the case of the first embodiment, and a gain of the negative feedback amplifier 10 can be maintained within a predetermined range. Furthermore, since both ends of the by-pass condenser 20 are surely interrupted from the input terminal 12 and output terminal 13 of the inverting amplifier circuit 14 by opening and closing operations of each of the switching devices 27 and 28, the occurrence of parasitic capacity caused by hanging of the by-pass condenser can be prevented and, as a result, fluctuations in frequency characteristics caused by the parasitic capacity described above can be prevented, thus avoiding variations in operational characteristics of the negative amplifier circuit 10 caused by changes in the frequency characteristics of the inverting amplifier circuit 14.

The diodes 27 and 28 can be inserted in a reverse-biased direction and each of them can be operated using its breakdown voltage as a threshold voltage. Moreover, instead of the variable impedance devices such as the above-described FETs or diodes, an ON/OFF switching device in which the impedance can be changed between 2 values, a 0 (zero) and ∞ may be used.

Because the impedance $R_f$ of the feedback circuit 15 can be changed gradually, thus preventing rapid stepwise changes in the gain of the feedback circuit to obtain a smooth change of the gain by using the variable impedance device as the switching device, it is preferable to use such devices having variable impedance.

As described above, in the negative feedback amplifier according to the present invention, the feedback circuit is connected in parallel to the inverting amplifier circuit and the feedback circuit is provided with the first feedback resistor connected in parallel to the inverting amplifier circuit and with the second feedback resistor connected in parallel to the first feedback resistor and with the by-pass condenser, and both ends of the by-pass condenser can be connected, together with the second feedback resistor, to the inverting amplifier circuit through the first and second switching devices.

Moreover, according to configurations of the present invention, the impedance of the feedback circuit that may be caused by the insertion of the second resistor connected to the first feedback resistor can be decreased and, even if an extension of the frequency band characteristics caused by the decrease in the impedance occurs, an occurrence of a peak of high frequency components found in the frequency characteristics of the impedance can be prevented owing to the by-pass action of the by-pass condenser, thus making it possible to obtain flattened frequency characteristics.

Additionally, while the first and second switching devices are in a cut-off state, since the both ends of the by-pass condenser are surely interrupted from the inverting amplifier circuit, the addition of parasitic capacity caused by the addition of the by-pass condenser to the inverting amplifier circuit can be avoided.

Therefore, according to the present invention, changes in impedance of the feedback circuit can be properly adjusted without the addition of parasitic capacity caused by the by-pass condenser to the inverting amplifier circuit, thus making it possible to achieve excellent gain characteristics which can provide flattened characteristics within a specified frequency range.

Moreover, according to the present invention, by using variable impedance devices such as diodes or FETs, changes in impedance of the feedback circuit occurring at the time of switching operations of the switching devices can be made smooth, thus providing smooth changes in the gain within a predetermined range.

Furthermore, according to the present invention, by using enhancement mode FETs or diodes as switching devices, any special by-pass circuit to control operations of the switching devices is not required, allowing the switching devices to be operated preferably in accordance with the gain obtained between the input and output terminals of the inverting amplifier circuit.

It is apparent that the present invention is not limited to the above embodiments but may be changed and modified without departing from the scope and spirit of the invention.

What is claimed is:

1. A negative feedback amplifier for use with integrated circuits comprising an inverting amplifier circuit provided with an input terminal and an output terminal used to amplify an input signal fed to said input terminal and to output the amplified signal in reverse phase and a feedback circuit mounted between said input terminal and said output terminal in parallel to said inverting amplifier circuit;

whereby said feedback circuit has a first feedback resistor connected between said input terminal and said output terminal, a first switching device one end of which is connected to said input terminal and which is put in an open state while a gain of said output signal to said input signal is not more than a predetermined value and is put in an closed and connected state while said gain exceeds said predetermined value, a second switching device one end of which is connected to said output terminal and which is put in an open state while said gain is not more than said predetermined value and is in a closed and connected state while said gain exceeds said predetermined value, a second feedback resistor connected between said both switching devices and in parallel to said first feedback resistor used to decrease impedance of said feedback circuit by closing and connecting operations of said switching devices, and a by-pass condenser connected in parallel to said second feedback resistor used to improve flatness of frequency characteristics for high frequency region on an output signal from said output terminal while said both switching devices are in a closed and connected state.

2. The negative feedback amplifier according to claim 1, wherein said first and second switching devices are variable impedance devices the impedance of which is changed depending on a voltage applied between said both terminals of said switching devices.

3. The negative feedback amplifier according to claim 2, wherein said variable impedance devices are comprised of diodes which allow a current to flow when a voltage applied to both ends of said diodes exceeds said predetermined value.

4. The negative feedback amplifier according to claim 2, wherein said variable impedance devices are field effect transistors (FET) having a pair of electrodes composed of a source and a drain, and a gate.

5. The negative feedback amplifier according to claim 4, wherein one electrode of a first FET is connected to said input terminal, the other electrode of the first FET is connected to one end of said second feedback resistor, said gate is connected to either electrode of said pair of electrodes of said first FET, one electrode of a second FET is connected to the other end of said feedback resistor and the other electrode of said second FET is connected to said output terminal, and said gate is connected to either electrode of said pair of electrodes of said second FET.

6. The negative feedback amplifier according to claim 5, said first FET is an enhancement mode n-channel FET a drain and a gate of which are connected to said input terminal and a source of which is connected to said one end of said second feedback resistor, and said second FET is an enhancement mode n-channel FET a drain and a gate of which are connected to the other end of said second feedback resistor and a source of which is connected to said output terminal.

7. The negative feedback amplifier according to claim 5, wherein a voltage difference between the source and the gate of each of said FETs becomes equal to a threshold value of each of said FETs when said gain reaches said predetermined value.

8. The negative feedback amplifier according to claim 7, wherein each of said FETs reduces impedance between the source and the drain when a voltage difference between the source and the gate of each of said FETs exceeds a threshold value of each of said FETs, causing said second feedback resistor connected between both FETs to be connected substantially to said feedback circuit.

9. The negative feedback amplifier according to claim 8, wherein each of said FETS is an enhancement mode transistor having a high impedance which substantially interrupts said second feedback resistor from said feedback circuit when a voltage difference between the source and the drain is 0 (zero) volts.

10. The negative feedback amplifier according to claim 8, wherein said by-pass condenser is substantially interrupted from said feedback circuit when a voltage difference between the source and the gate of said both FETs is not more than a threshold value of each of both FETs, preventing the occurrence of parasitic capacity caused by the insertion of said condenser in said inverting amplifier circuit.

* * * * *